(12) United States Patent
Motowidlo

(10) Patent No.: US 7,752,734 B2
(45) Date of Patent: Jul. 13, 2010

(54) METHOD FOR MANUFACTURING SUPERCONDUCTORS

(75) Inventor: Leszek Motowidlo, Southington, CT (US)

(73) Assignee: Supramagnetics, Inc., Plantsville, CT (US)

( * ) Notice: Subject to any disclaimer, the term of this patent is extended or adjusted under 35 U.S.C. 154(b) by 696 days.

(21) Appl. No.: 11/594,563

(22) Filed: Nov. 8, 2006

(65) Prior Publication Data

US 2008/0188372 A1    Aug. 7, 2008

Related U.S. Application Data

(60) Provisional application No. 60/735,144, filed on Nov. 8, 2005.

(51) Int. Cl.
*H01B 12/10* (2006.01)
(52) U.S. Cl. .................. 29/599; 174/125.1
(58) Field of Classification Search ............ 29/599; 174/125.15, 125.1; 505/806, 815, 929, 930
See application file for complete search history.

(56) References Cited

U.S. PATENT DOCUMENTS

| | | | |
|---|---|---|---|
| 3,930,903 A * | 1/1976 | Randall et al. ............ 428/662 |
| 4,863,804 A | 9/1989 | Whitlow et al. | |
| 4,929,596 A | 5/1990 | Meyer et al. | |
| 4,973,365 A | 11/1990 | Ozeryansky et al. | |
| 5,475,915 A | 12/1995 | Valaris | |
| 5,798,312 A * | 8/1998 | Okada et al. ............ 505/230 |
| 6,192,573 B1 | 2/2001 | Hahakura et al. | |

OTHER PUBLICATIONS

International Search Report and Written Opinion dated Apr. 2, 2008 from corresponding PCT/US2006/043554.
H. Hillman "Fabrication Technology of Superconducting Material" Superconductor Materials Science Metallurgy, Fabrication, and Applications, Chapter 5, pp. 299-317, 1981.
E.W. Collings "Billet Design" Applied Superconductivity, Metallurgy, and Physics of Titanium Alloys, Chapter 28, vol. 2, pp. 434-458, 1986.
International Preliminary Report on Patentability and the Written Opinion of the International Search Authority dated Jun. 24, 2008, from the corresponding International Application.

* cited by examiner

*Primary Examiner*—A. Dexter Tugbang
*Assistant Examiner*—Livius R Cazan
(74) *Attorney, Agent, or Firm*—Katten Muchin Rosenman LLP

(57) ABSTRACT

A method for forming improved superconducting composites having improved Jc values by assembling octagonal or curved octagonal elements which when assembled allow for formation of uniformly continuously spaced voids. The voids are then filled with a metal, alloy, intermetallic substance, or ceramic oxide. The assembly of the octagonal elements and the filling of the voids is performed in a metal can. Accordingly, the flexibility in design of the present invention allows control of the performance of the superconductor and is cost effective.

14 Claims, 4 Drawing Sheets

METHOD FOR MANUFACTURING SUPERCONDUCTORS

RELATED APPLICATION

This application claims priority from U.S. Provisional Application No. 60/735,144 filed on Nov. 8, 2005, incorporated herein by reference.

FIELD OF THE INVENTION

The invention relates generally to methods of making superconductors and, more particularly, improved low and high temperature superconducting composites, and high strength normal conductors.

BACKGROUND OF THE INVENTION

Superconductors are used both in electronic circuitry and in bulk applications, most of which are based on high-field electromagnetic coils. In 1911, Onnes discovered that the electrical resistance of mercury fell sharply at approximately 4 K and was immeasurable below this temperature. Onnes termed this the "superconducting state". The temperature at which this phenomenon occurs is the critical temperature ($T_c$), and is one of the three critical properties of superconducting materials.

When certain materials enter the superconducting state by cooling below a critical temperature Tc, their electrical resistance drops to zero and they carry electrical current with no power dissipation and no heating. This phenomenon is very weak and is easily destroyed by thermal agitation. Thus, all superconductors require a cryogenic environment with most practical superconducting devices operating in liquid helium (Tc=4 K), or in liquid nitrogen (Tc=77 K).

When the temperature exceeds a critical temperature, Tc, or when the critical field, Hc, is exceeded, superconductivity is destroyed and the material then behaves normally. Superconductivity is also destroyed, even in the absence of an external magnetic field, when the current flowing through the superconductor reaches a critical value Jc.

Tc and Hc are physical characteristics of a given material or composition, but Jc is more dependent on the structural properties and history of the material. The three critical properties of a superconductor, Hc, Tc, and Jc are interdependent and create a three-dimensional space within which lossless bulk supercurrents can flow. These superconductors are referred to as (Type I) superconductors.

In practical high field (Type II) superconductors, the critical field Hc is replaced by a low critical field $H_{c1}$ and an upper critical field $H_{c2}$. In between these two critical fields the superconductor is in the so called mixed state. When the magnetic field exceeds a value of $H_{c1}$, the magnetic flux can penetrate into the bulk of the material in the form of fluxoids (individual quantum units of flux surrounded by a circulating vortex of supercurrent) until a much higher magnetic field $H_{c2}$ is reached, where the fluxoids overlap and the material become normal or resistive.

Under changing magnetic fields, the fluxoids move and generate heat. It is necessary to remove the heat generated to maintain the low temperature required for superconductivity. One technique for removing heat is to surround the superconducting material with a good thermal conductor. The combination of very small superconducting filaments (high surface area) embedded in a material of high conductivity has been used successfully to solve this problem.

As current is introduced into the superconductor, a Lorentz force ($F_L = J \times B$), perpendicular to the applied current and field acts on the fluxoids. In an ideal material with no imperfections in the field region between $H_{c1}$ and $H_{c2}$, transport currents would normally cause the fluxoids to move due to the Lorentz force, and the material would go normal resulting in a low critical current density, ($J_c$). However, grain boundaries, dislocations, and other imperfections can trap or pin the fluxoids and enable a high $J_c$ to be obtained in these materials even at high magnetic fields. Such defects are therefore, referred to as pinning sites or pinning centers. Therefore, it is desirable to prevent the fluxoids from moving. These pinning sites offer an opposing force to $F_L$ known as the flux pinning force, Fp. The critical current density Jc can thus be defined as $F_p = J_c \times B$. If the applied field or current is great enough, $F_L$ exceeds $F_p$ and flux motion occurs.

By the 1960's it was recognized that a $Nb_3Sn$ superconductor could sustain critical current densities ($J_c$) exceeding $10^3$ A/mm² even in fields as high as 8.8 T. It was discovered that a class of superconductors with an upper critical field ($Hc_2$) much higher than $Hc_1$ existed. Most of the superconducting materials used in engineering applications today exhibit this type of superconductivity.

In the manufacture of practical high-field superconductors, the aim is to optimize simultaneously $Hc_2$, $T_c$, $J_c$ and the mechanical properties of the material. Most superconductors currently being manufactured are made as tape or wire. Thus, optimization must be done to material in either a tape or wire form and hence suitable for winding into coils. Wire consists of a composite of fine (<100 μm), twisted, superconducting filaments embedded in a non-superconducting matrix. This non-superconducting matrix is a material of high thermal and electrical conductivity such as copper which is typically utilized as stabilization against transients which may otherwise push the superconductor into the normal state.

To achieve a high critical current density ($J_c$) in a magnetic field, a superconductor must have defects or second-phase inclusions that pin the fluxoids (the vortex lattice) at the location of the defect. This microstructure can be produced in Nb47 wt % Ti, the dominant material used for commercial electromagnet applications such as Magnetic Resonance Imaging (MRI) by applying heat treatments to precipitate α-Ti out of a homogeneous Nb47 wt % Ti alloy. However, this approach limits the maximum Ti pin volume to approximately 21%. Other methods of artificially increasing the defect density have also been attempted including ion radiation and cation substitution.

A second method, artificial pinning centers (APCs), has been used to introduce pins in Nb47 wt % Ti wires. Artificial pins are placed in the Nb47 wt % Ti at a macroscopic size after which the composite wire is repeatedly drawn to produce nanometer pin thickness and spacing. The artificial pin materials used have been either Nb (low field superconductors), Cu or Ti (normal state metals). The optimum pin volume has been between 10% and 30%. APC composites can approximate ideal flux-pinning structures in a controlled design approach, which makes them valuable for all superconductors.

Another important example of Type II superconductors is $Nb_3Sn$. This superconductor is a brittle intermetallic compound. Like Nb47 wt % Ti, this superconductor is embedded in a normal conducting matrix for electrical and thermal stability. These stability considerations further require the $Nb_3Sn$ filaments to be distributed as very fine filaments that are preferably smaller than 50 μm. Because $Nb_3Sn$ is a brittle intermetallic, Nb and Sn components are assembled with copper into a composite, then extruded and drawn into a wire while the composite is in a ductile state. The formation of the $Nb_3Sn$ superconductor is achieved when the wire is at final size. The formation of $Nb_3Sn$ occurs through a solid-state diffusion reaction at high temperature (about 600° C. to 800° C.) in an inert atmosphere. During the reaction Sn diffuses into the Nb filaments and forms $Nb_3Sn$.

After the reaction to form $Nb_3Sn$ is completed, the matrix surrounding the filaments still contains a significant amount of Sn and, therefore, has a relatively high resistance. This area, that is the filaments and matrix together with that of the diffusion barrier, is generally referred to as the non-copper area and is the area which is used to calculate the current densities. The diffusion barrier separates the non-copper area from the copper stabilizer needed for good electrical and thermal stability.

Generally, there are three large scale processes to fabricate LTS $Nb_3Sn$ wire. The first approach is the so called "bronze process". In this approach the Nb filaments are embedded in a bronze matrix that includes about 13 wt % Sn. The Nb filaments and bronze matrix are typically separated from the outer copper stabilizer by a diffusion barrier. This method requires intermediate anneals and is disfavored for uses requiring higher superconducting $J_c$ because of low amounts of supercurrent delivered at high magnetic fields compared to the second approach, the so called "internal-tin" or "external-tin process".

In the internal-tin approach Sn cores are surrounded by Nb filaments embedded in a copper matrix. The entire sub-element or sub-elements if more than one Sn core is involved is again surrounded by a diffusion barrier with the copper stabilizer on the outside. In the case of the external-tin approach, the Sn cores are located outside the bundle of copper clad Nb filaments. A diffusion barrier surrounding the Cu, Nb, and Sn components is also included as utilized in the internal-tin approach.

The third approach is the "powder-in-tube" (PIT) process. In the PIT process a powder such as $NbSn_2$ containing 72 wt % Sn is inserted in Nb tubes and these Nb rods are then stacked in a Cu stabilizer matrix. This method, which is described in U.S. Pat. No. 5,043,320 to Meyer, et al is incorporated by reference herein.

There remains a need for superconductors with high Jc values and design flexibility which can be economically produced in bulk and which are suitable for different superconducting applications. There is also a need in the superconductor community to improve the cost-effectiveness and design flexibility of $Nb_3Sn$, NbTi and other superconductors. The present invention method improves the general qualities and characteristics of superconductors.

SUMMARY OF THE INVENTION

According to an objective of the present invention, there is provided an improved method of making composite conductors, especially low temperature superconducting (LTS) composites, high temperature superconducting (HTS) composites and high strength normal conductors, the method comprising: preparing composites from filaments configured in an octagonal or curved octagonal shape to provide regularly spaced voids among the filaments and filling the voids with a material of choice to provide composites with significantly improved structural and/or electrical/magnetic characteristics.

It is an object of the present invention to allow a low cost method of improving the critical current density, Jc by providing more effective artificial pinning centers in the production of $Nb_3Sn$ and NbTi superconductors.

It is also an object of this invention to provide design flexibility in the production of $Nb_3Sn$, NbTi, and other superconductors and a wider range of applications for the finished materials.

It is yet another object of this invention to provide high strength normal state metals and superconductors.

According to still another object of the present invention, there is provided a method for the assembly and fabrication of a composite material containing at least two metal components. In particular, the method comprises assembling octagonal elements shaped such that, when assembled, they allow the formation of uniform continuously spaced square, quadrilateral or rounded voids; filling the voids with another metal, alloy, intermetallic, or ceramic oxide; wherein the assembly of the octagon elements and filling of the voids with metal, alloy, intermetallic, or ceramic oxide is performed inside a copper, aluminum, or silver can. After assembly the top and bottom of the formed billet is closed and welded under a vacuum with a copper, aluminum, or silver nose and lid. The welded billet assembly is then processed by conventional mechanical metallurgy into a composite material having a final form of a rod, plate, or wire.

The voids may function as artificial pinning sites. Pinning sites when strong enough may trap fluxoids and prevent them from moving, thereby increasing the critical current density, Jc. The voids may be filled with normal state metals such as Cu, Ti, Nb and alloy combinations of these metals. The voids may include magnetic materials as strong pins such as Ni, Fe, or Gd, and combinations with non-magnetic metals such as Cu, Ag, Ti or Nb.

According to still another object of the present invention, the voids may be filled with Sn, Sn alloys or Sn intermetallic powder compounds as a tin source for $Nb_3Sn$ superconductors. The voids may also be filled with strengthening materials to provide a more robust superconducting composite or non-superconducting composite.

As used herein, the term critical current density (Jc), is defined as the maximum measured supercurrent divided by the overall filament diameter at a specified temperature and magnetic field.

As used herein, an artificial pinning centers may be distinct normal regions (second phase) or magnetic regions with a specified volume associate with each pin. Optimal flux line pinning occur when there is a one-to-one match between pin spacing and flux line spacing.

These novel features of the present invention will become apparent to those skilled in the art from the following detailed description, which is simply, by way of illustration, various modes contemplated for carrying out the invention. As will be realized, the invention is capable of additional, different obvious aspects, all without departing from the invention. Accordingly, the Figures and specification are illustrative in nature and not restrictive.

DETAILED DESCRIPTION OF THE PREFERRED EMBODIMENTS

Figure 1:
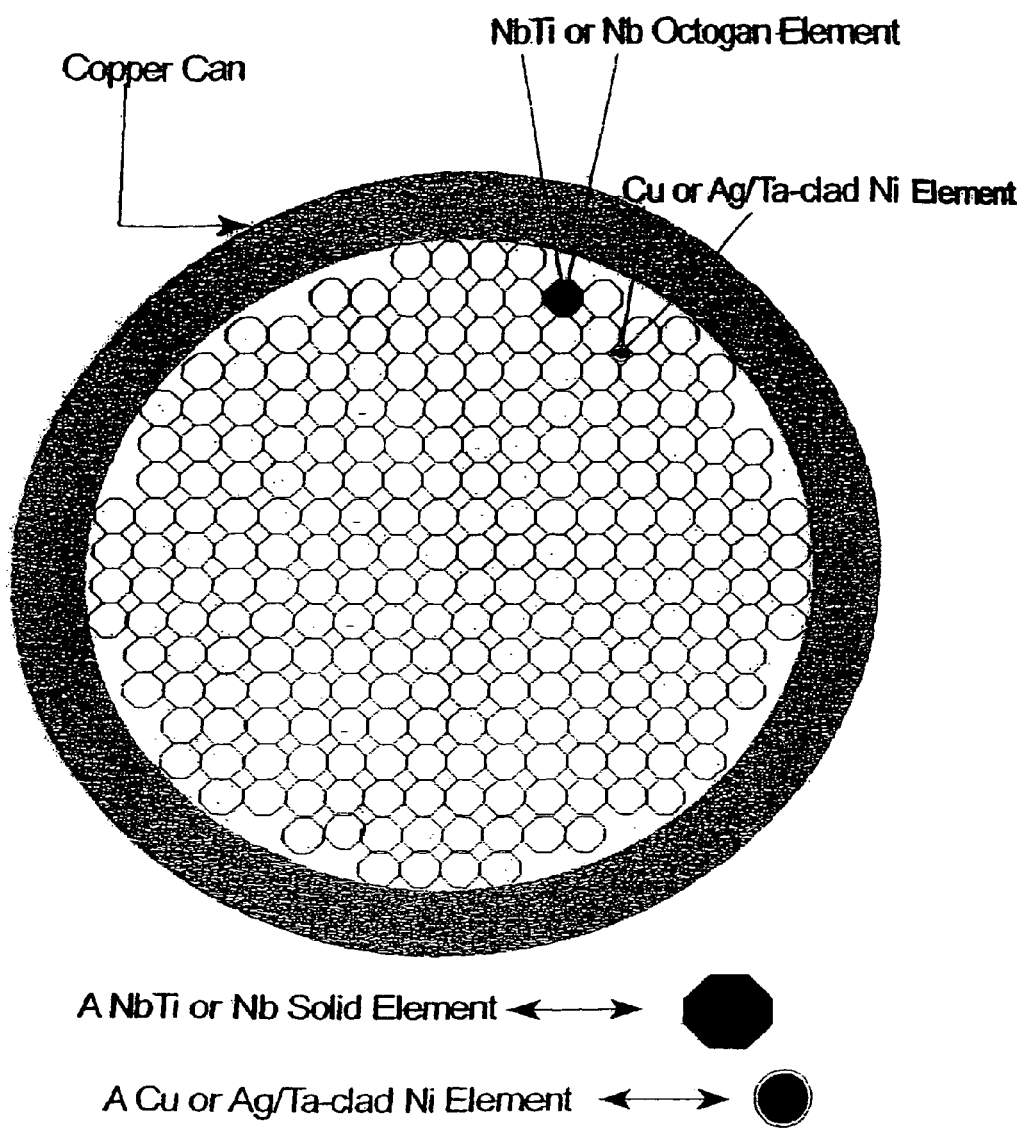
FIG. 1 is an enlarged cross-sectional illustration of the NbTi or Nb octagonal elements with nickel, copper or any non-superconducting metal or alloy.

Embodiments of the present invention provide an improved method of making composite conductors, especially low temperature superconducting (LTS) composites, high temperature superconducting (HTS) composites and high strength normal conductors. The composites are prepared from filaments configured in an octagonal or curved octagonal shape to provide regularly spaced voids among the filaments. These voids are filled with a material of choice to provide composites with significantly improved structural and/or electrical/magnetic characteristics.

The present invention may be usefully employed to improve the superconducting qualities and robustness of a wide range of conventional superconductivity materials and high Tc materials, either singly or in mixtures.

In one embodiment, in the field of low temperature superconductors, the presently disclosed method may be preferably utilized to fabricate wires of high performance NbTi, $Nb_3Sn$, or intermetallics such as NiAl or $Nb_3Al$, or mixtures thereof with improved mechanical and electrical properties. Examples of other suitable combinations of other materials which can be improved by the methods the present invention would include, but not be limited to Pb/Mo/S, Eu/Mo/S, Sn/Eu/Mo/S, Pb/Eu/Mo/S, La/Eu/Mo/S, Sn/Al/Mo/S, Nb/N, Mo/N, V/Si, Nb/Si, Nb/Al/Ge, Nb/Al, Nb/Ga Nb/Ti and Nb/Zr.

In another preferred embodiment, in the field of high temperature superconductors, the presently described method may be utilized to fabricate superconductors. Examples of suitable superconductors include, but are not limited to, $XBa_2Cu_3O_{7-e}$ where X may be Y, Nd, Sm, Eu, Gd, Dy, Ho, Er, Tm, Rb, and Lu or other rare earth elements and O may be partially replaced by F, Cl, or other halogens and where e is small number less than 1.

Examples of some of the newer materials are $Bi_2 Sr_2 Ca1 Cu_2 Ox$, $Ti_2 Ca_2 Ba_2 CU_3 Oy$, and other related compounds. Additionally, newly discovered compounds which have a different electronic structure from the high-Tc compounds are being developed and will also benefit from the processing techniques of the present invention. These materials have electron charge carriers, rather than hole charge carriers in the high-Tc materials. These include $Nd_{2-x}Ce_x CuO_4$.

In the field of high temperature superconductors, the presently described method may be preferably utilized to fabricate superconductors such as $Bi_2Sr_2Ca_1Cu_2Ox$, where x is an integer between 1 and 10, and $Bi_2Sr_2Ca_2Cu_3Ox$, $Y_1Ba_2Cu_3O_x$ (i.e. Y123), $MgB_2$, where x is an integer between 1 and 7, and other related compound superconductors with improved mechanical properties and a low silver fraction. However, it is understood other rare earth elements may be substituted for Y.

In one embodiment relating to low temperature superconductors, significant enhancement in $J_c$ may be gained over conventionally processed low temperature superconductors by filing the voids with a material that acts as an artificial pinning center. The orderliness and spatial configuration of the voids allows a uniform and controlled approach to the degree of pinning desired.

For example, the integration of NbTi or Nb octagonal elements during the initial assembly of the composite provides for the natural formation of uniform regularly spaced voids for practical incorporation of pinning centers within the NbTi or Nb matrix.

In a significant advance over the prior art, the area of the voids may be modified by adjusting the shape of the NbTi or Nb octagons from 8 equal sides to 4 smaller equal sides and 4 larger equal sides thereby increasing the available volume fraction of voids available for use as pinning centers or strengthening elements. This flexibility in design allows control of the performance of the superconductor.

In another embodiment the sides of the elements are slightly curved.

In yet another embodiment, the octagonal elements are the NbTi or Nb superconductor and the voids are filled with pinning centers that may be nickel, iron, copper, niobium, gadolinium or any non-superconducting metal or alloy.

An illustration of the NbTi or Nb octagonal elements, preferably with nickel, copper, or with any non-superconducting metal or alloy, is shown in FIG. 1. After the assembly of NbTi or Nb octagonal elements with straight or curved artificial pinning centers in a copper billet, the billet is extruded and cold drawn. The extruded and cold drawn composite, incorporating uniform regularly spaced artificial pinning centers, constitutes the copper-clad element and may be round or hexagonal. In conventional superconductor processing, these elements are typically 0.048" to 1" diameter. These elements, like conventional elements, are then assembled into a copper can in accordance with a desired composite design for a particular device application.

The copper-clad NbTi or Nb superconducting elements incorporating the uniformly spaced artificial pinning centers are then further mechanically processed by hot extrusion and cold drawing to a final element or filament diameter on the order of 1 to 100 microns within the copper matrix. The exact filament diameter is dependent on the number of filaments and the superconducting fraction in the conductor cross-section for a particular device application. At final conductor diameter, the artificial pin diameter within each filament is approximately 10 nanometers for efficient interaction with the magnetic flux lattice of the superconductor. An artificial pinning diameter on the order of 10±5 nanometers is an appropriate size.

By the term "hot extrusion" is meant that the composite billet is heated to a high temperature of about 400° C. to about 800° C. prior to extrusion. The billet is pushed to small diameters when very hot.

By the term "cold extrusion" is meant that the billet is extruded at room temperature.

The octagon elements may be manufactured utilizing shaped octagon drawing dies or by utilizing a turks head device. The turks head approach may be more cost effective and allows a continuous long length shaping of base NbTi or Nb elements without copper sheeting.

Another example of the use of the disclosed elements is for the enhancement of mechanical strength in conventional superconducting or normal conducting composites.

Electromagnets generating high magnetic fields also develop large perpendicular forces called Lorentz forces on the superconducting windings. This Lorentz force results in significant hoop stresses felt by the superconductor, degrading the $J_e$ performance as a function of the applied magnetic field.

Magnet engineers carefully consider coil design to minimize this effect, often increasing the complexity of the coil winding and adding weight and cost to the overall device.

Special winding techniques and overbanding with high strength steel is required for high magnetic field high performance coils. This is particularly important for coils utilizing the brittle $Nb_3Sn$ superconductor as well as NbTi coils.

Figure 2:
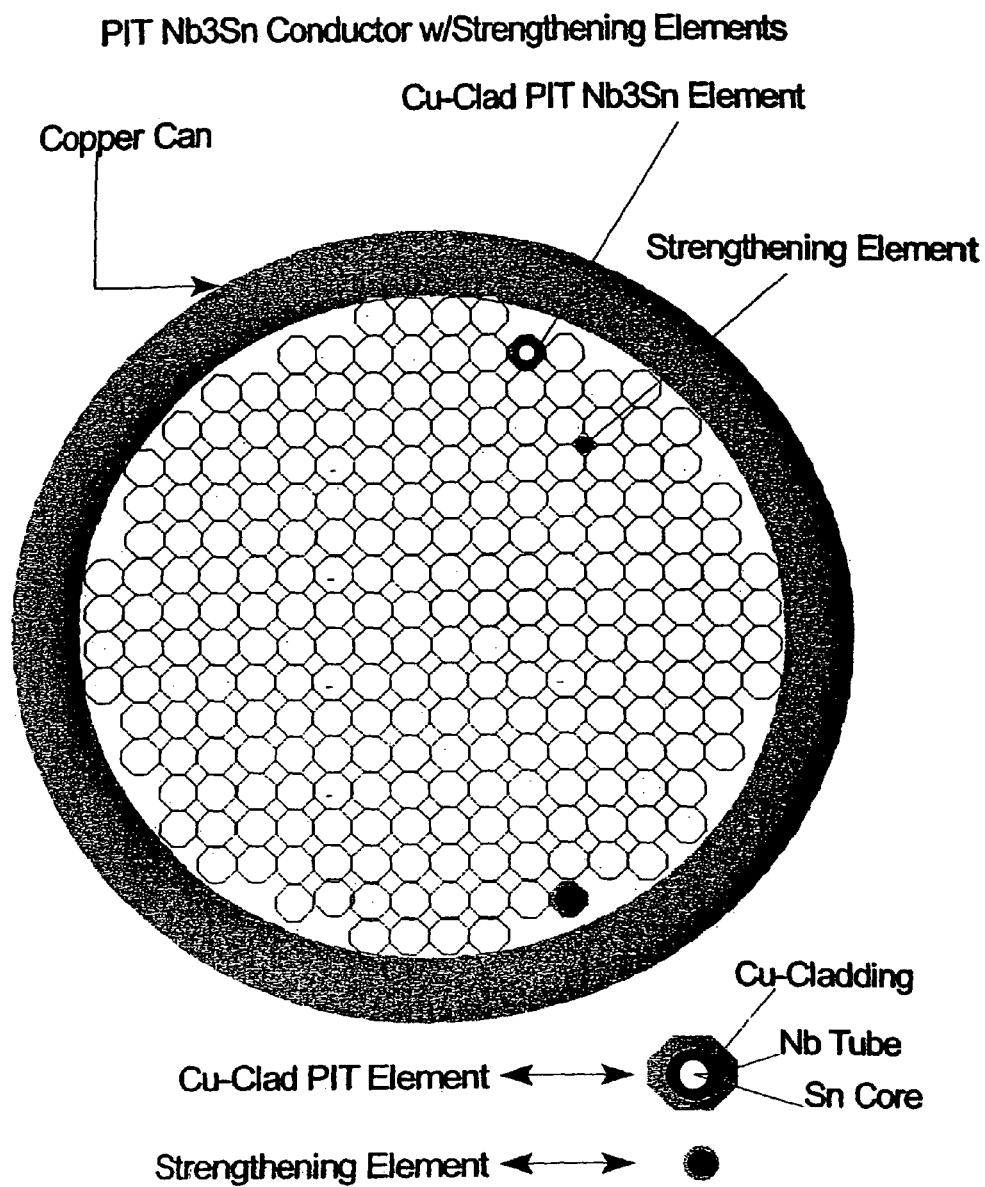
FIG. 2 is an enlarged cross-sectional illustration of the powder-in-tube $Nb_3Sn$ approach with strengthened metal or alloy components via the voids.

In one preferred embodiment, high strength metal or alloy components may be incorporated into the composite via the regularly spaced voids formed after assembling the octagonal superconducting elements. The octagonal elements may be any copper-clad superconductor having one or more filaments. This invention may apply to copper-clad NbTi composites, bronze $Nb_3Sn$ composites, internal-tin $Nb_3Sn$ composites, powder-in-tube $Nb_3Sn$ composites, internal-tin tube $Nb_3Sn$ composites, and distributed-tin $Nb_3Sn$ composite designs. An example of the powder-in-tube $Nb_3Sn$ approach with strengthened metal or alloy components via the voids is shown in FIG. 2.

A further embodiment of this invention in the field of low temperature superconductors is the effective distribution of tin (Sn) into the Nb filaments to form the $Nb_3Sn$ superconductor.

A copper-clad octagon composite having one or more Nb filaments is assembled. The voids are filled with Sn rod, Sn alloy rod, Sn powder, Sn alloy powder, dispersion strength Sn, $NbSn_2$ powder, $Cu_5Sn_4$ powder, $Nb_6Sn_5$ powder, $Ni_3Sn_4$ or any intermetallic Sn compound.

Figure 3:
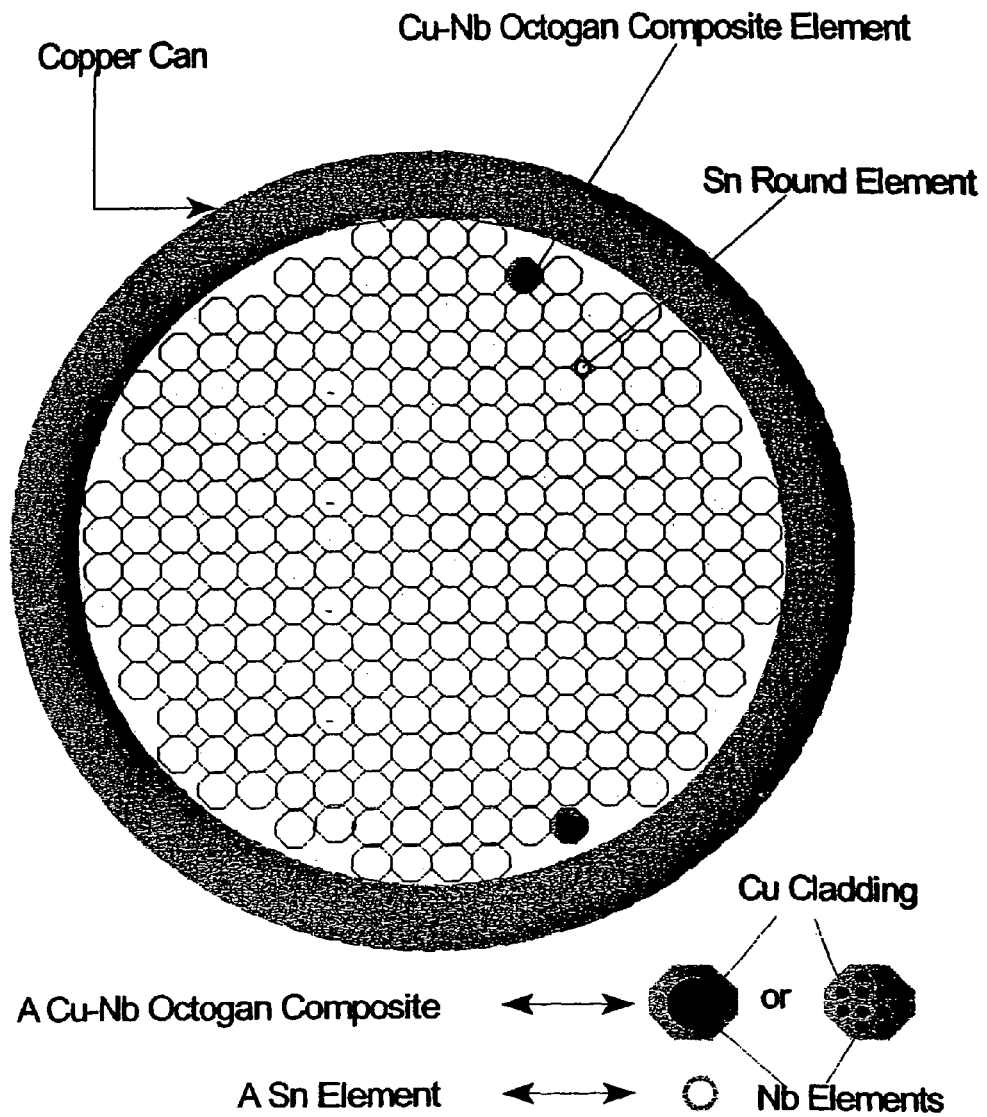
FIG. 3 is an enlarged cross-sectional illustration of a design utilizing a copper-clad Nb octagon element with uniformly distributed Sn via the voids or copper-clad octagon element comprising of several or more Nb filaments and Sn distributed via the uniformly spaced voids.

A schematic of a design utilizing a copper-clad Nb octagon element with uniformly distributed Sn via the voids is shown in FIG. 3. FIG. 3 is also an illustration of a copper-clad octagon element comprising several or more Nb filaments and Sn distributed via the uniformly spaced voids.

A further use of this invention is in the field of first generation high temperature superconductors. HTS wires and cables fabricated by the powder-in-tube method require a considerable amount of silver (in state of the art double stack approach) to achieve the density in the final filaments for optimum $J_e$ performance. This results in a low superconducting fraction and high silver fraction and hence a low engineering current density, $J_e$. The excessive silver content contributes to the high cost of the conductor as well as resulting in a low current carrying capacity.

Another technical disadvantage to the utilization of pure silver as the matrix is that the mechanical properties are low. Therefore, more expensive dispersion strengthened silver alloys have been proposed and are used in the current advanced prototypes for device applications. In order to bring HTS wire and tapes to the marketplace the superconducting fraction must increased and the silver content significantly reduced or eliminated.

Figure 4:
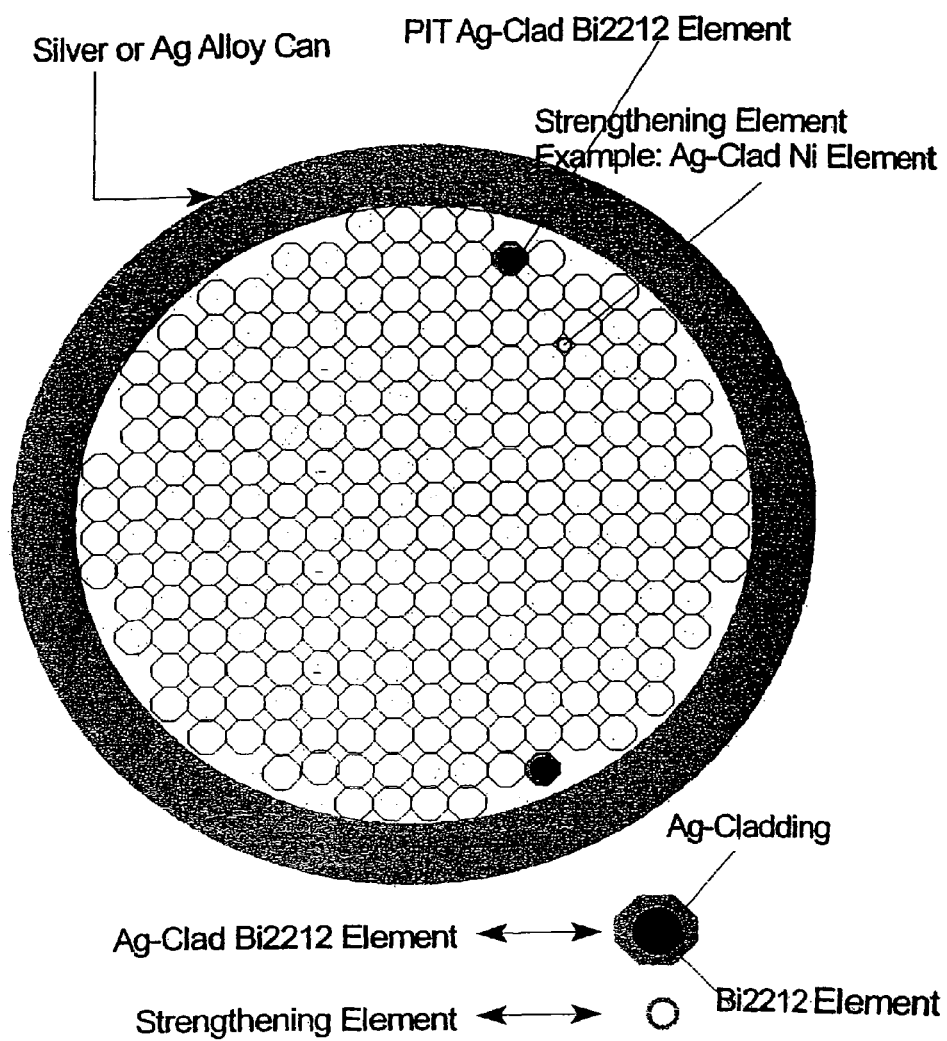
FIG. 4 is an enlarged cross-sectional illustration of octagon shaped HTS elements in a silver matrix to provide square voids where high strength components such as nickel, steel, etc. may be included prior to the composite being processed by conventional mechanical metallurgy to form the desired high strength superconducting wire.

Assembly of octagonal shaped HTS elements in a silver matrix provides square, quadrilateral or slightly curved voids where high strength components such as Nb clad nickel, steel, etc. may be included. Such a composite is then processed by conventional mechanical metallurgy to form the desired high strength HTS wire. An illustration of this design is shown in FIG. 4.

The size of the octagonal element may vary within a range of from about 1.5 to about 25 mm, preferably from about 2.5 to about 20 mm, and most preferably from about 4 to about 15 mm.

Where the faces of the octagonal element are rounded, alternate faces of the element are straight and alternate faces rounded. The rounded faces have a radius of from about 1.0 to about 10 mm, preferably from about 2.0 to about 8.0 mm, and most preferably from about 2.5 to about 7.5 mm.

The area of the void may vary within a range of from about 0.80 to about 80 $mm^2$, preferably from about 1.25 to about 60 mm, and most preferably from about 2.5 to about 50 $mm^2$.

Where the area of the void is filled with an APC, typically the percentage of total area which is the pinning center is in the range of from about 2% to about 40%, preferably from about 5% to about 30%, and most preferably from about 10% to about 25%.

Enhanced design flexibility is obtained when opposing sides of the octagonal element have different sizes. The ratio of opposing sides can vary from 1:1 when they are equal to a range of from about 1:1 to about 1:0.1, preferably from about 1:0.8 to about 1:0.2 and most preferably from about 1:0.75 to about 1:0.25.

While certain preferred and alternative embodiments of the invention have been set forth for purposes of disclosing the invention, modification to the disclosed embodiments can occur to those who are skilled in the art.

The above-described methods are applicable to production of high Tc superconducting materials in a bulk form, or in a thin or thick film forms. The material may be used for production of wire or ignots with high values of Jc. The superconducting materials may be used in numerous applications including transmission lines, or cables, bulk fault current limiters, high field magnets or trapped field magnets for motors, generators, particle separators, flywheels or accelerators, energy efficient large dipole magnets for industry or laboratory use, magnet systems for military, high energy physics, materials processing, bearings, levitation for trains and other transportation uses, magnets for bumper-tether and medical uses. The superconducting thick films may be used for resonator cavities, superconducting shields and other uses. The superconducting films may be used for dc or rf SQUIDs or other SQUID based instruments, switching devices, logic gates, memory cells, analog-to-digital converters, arrays as high frequency sources, quasiparticle mixers and detectors, hybrid superconductor-semiconductor devices, non-equilibrium super-conducting devices, and other three-terminal devices.

The following examples describe specific aspects of the invention to illustrate the invention and provide a description of the present methods for those skilled in the art. The Examples should not be construed as limiting the invention as the examples merely provide specific methodology useful in the understanding and practice of the invention and its various aspects.

EXAMPLES

Example 1

An Octagonal Design for Composite Superconductors

This approach is applied for the $Nb_3Sn$ powder-in-tube (PIT) process, where a 0.5" od by 0.375" id Nb tube or Nb-7.5Ta tube is filled with $Cu_5Sn_4$ intermetallic powder to tap density. The filled tube is then plugged from each end and inserted into a copper tube of 0.650" od by 0.5" id. After assembly, the PIT composite is drawn through a series of dies to a round diameter of 0.144" od. The final draw is through an octagon die shaping the outer PIT composite diameter into an octagon. At the final octagon size the flat to flat diameter over the octagon sides is 0.137". At this size the octagon composite is cut into equal lengths (determined by the desired length of the billet to be assembled) and 240 are assembled into a 2.5" od copper tube of a length from 3 feet to 8 feet long. After assembly of the octagonal elements in the copper tube, dispersion strengthened copper rods of the same length as the octagonal elements and of a diameter such that the copper rods fill the voids created by the octagonal, are inserted into the voids. The ends of the assembled octagonal composite billet is then closed at each end by welding copper end caps. The entire assembly is now processed from 2.5" diameter to a final wire diameter dependent on the particular device application (0.020" od to 0.089" od) for most applications.

Example 2

An Octagonal Design for Composite Superconductors

This approach is applied for the $Nb_3Sn$ powder-in-tube (PIT) process and includes the fabrication of $Nb_3Sn$ wire using dimensions as described in Example 1 above. A copper clad Nb rod is processed and shaped into an octagonal element. The assembly into a second copper tube 2.5" od may be similar to the voids now being filled with Sn rods. The octagonal design approach provides a more efficient distribution of the Sn sources among the 240 Nb filaments at final wire size.

The invention claimed is:

1. A method for manufacture of superconductors comprising the steps of:
    assembling a plurality of substantially identical octagonal metal elements, each such element comprising eight distinct sides, at least four alternating ones of said sides being straight, and eight distinct corners positioned respectively between said eight sides, said plurality of elements assembled such that within each group of four such assembled elements each respective one of the elements has each of two of its alternating straight sides abutting a respective straight side of adjacent two such other elements, to form a void in between said group of four assembled elements, all such voids formed within the assembled plurality of substantially identical octagonal metal elements each being uniform in size, shape and spatial location throughout the assembly; and
    filling said voids with a substance selected from the group consisting of a metal alloy, intermetallic substance, and ceramic oxide.

2. The method of manufacture of superconductors as in claim 1, wherein the voids are of a shape selected from the group consisting of a square, quadrilateral and round.

3. The method of manufacture of superconductors as in claim 1, wherein the assembly of the plurality of substantially identical octagonal metal elements and the filling of the voids is performed in a metal can.

4. The method of manufacture of superconductors as in claim 1, where said metal elements comprise a material selected from the group consisting of Cu, Ti, Nb and alloy combinations of these metals.

5. The method of manufacture of superconductors as in claim 1, wherein the voids are filled with materials selected from the group consisting of magnetic materials, non-magnetic metals, Sn, Sn alloys, strengthening materials and Sn intermetallic powder.

6. The method of manufacture of superconductors as in claim 5, wherein Sn is used in the voids, and said Sn is used as a tin source for $Nb_3Sn$ superconductors.

7. The method of manufacture of superconductors as in claim 1, further comprising the step of forming said assembly in a can, filling the voids while in the can, closing the can to form a billet and welding the can under vacuum to form a nose and lid, said billet being processed into a composite material having a final form selected from the group consisting of a rod, plate and wire.

8. The method of manufacture of superconductors as in claim 1, wherein said superconductors are selected from the group consisting of $Nb_3Sn$ and NbTi.

9. The method of manufacture of superconductors as in claim 1, wherein said metal elements comprise a material selected from the group consisting of NbTi and Nb and said voids provide for practical incorporation of artificial pinning centers within the metal element assembly, wherein the metal elements improve the efficacy of the artificial pinning centers.

10. The method of manufacture of superconductors as in claim 1, wherein the material of said octagonal metal elements is selected from the group consisting of copper clad compositions, bronze $Nb_3Sn$ composites, internal-tin $Nb_3Sn$ composites, powder-in-tube $Nb_3Sn$ composites, internal-tin tube $Nb_3Sn$ composites, and distributed-tin $Nb_3Sn$ composites, the elements providing natural formation of uniformly spaced voids for practical incorporation of Sn, Sn alloy and Sn intermetallic compounds, wherein the elements improve the efficacy of distributing Sn into Nb for improved Jc performance.

11. The method of manufacture of superconductors as in claim 1, wherein the cross sectional area of each of such voids is in the range from about 0.8 $mm^2$ to about 80 $mm^2$.

12. The method of manufacture of superconductors as in claim 1, wherein the voids are is filled with artificial pinning centers.

13. The method of manufacture of superconductors as in claim 1, wherein each element has four small sides alternating with four larger sides to form the eight distinct sides of the octagonal metal element.

14. The method of manufacture of superconductors as in claim 1, wherein each side alternating with said straight side is rounded, concave inwardly into the element, whereby the voids are round.

* * * * *